United States Patent
Baydoun et al.

(10) Patent No.: US 12,356,564 B2
(45) Date of Patent: Jul. 8, 2025

(54) POWER DISTRIBUTION ASSEMBLY

(71) Applicant: FORD GLOBAL TECHNOLOGIES, LLC, Dearborn, MI (US)

(72) Inventors: Mohammed Michael Baydoun, Dearborn Heights, MI (US); Leena Shah, Rochester Hills, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 225 days.

(21) Appl. No.: 18/236,527

(22) Filed: Aug. 22, 2023

(65) Prior Publication Data

US 2025/0065833 A1    Feb. 27, 2025

(51) Int. Cl.

| H05K 5/02 | (2006.01) |
| B60Q 9/00 | (2006.01) |
| H05K 5/03 | (2006.01) |
| B60R 16/03 | (2006.01) |
| H02B 1/46 | (2006.01) |

(52) U.S. Cl.
CPC ............ *H05K 5/0217* (2013.01); *B60Q 9/00* (2013.01); *H05K 5/03* (2013.01); *B60R 16/03* (2013.01); *H02B 1/46* (2013.01)

(58) Field of Classification Search
CPC .................................. H02B 1/46; B60R 16/03
See application file for complete search history.

(56) References Cited

U.S. PATENT DOCUMENTS

| 9,048,579 | B2 * | 6/2015 | Itou ................. H01R 13/62944 |
| 9,124,081 | B2 * | 9/2015 | Kowtun .................. H02G 3/16 |
| 9,265,164 | B2 * | 2/2016 | Darr ...................... H01R 13/68 |
| 9,616,829 | B2 | 4/2017 | Stern et al. |
| 9,812,850 | B2 | 11/2017 | Kiyota et al. |
| 9,837,735 | B2 | 12/2017 | Carnick et al. |
| 11,558,972 | B2 | 1/2023 | Salayandia et al. |
| 2020/0406841 | A1 * | 12/2020 | Carnick ............. B60R 16/0238 |

FOREIGN PATENT DOCUMENTS

| CN | 10036449 A1 | 2/2002 |
| CN | 106773984 A | 5/2017 |

OTHER PUBLICATIONS

Littelfuse, Inc., DC Power Distribution, Market and Custom Solutions for Vehicle DC Power Distribution, pp. 1-14.

* cited by examiner

*Primary Examiner* — Mukundbhai G Patel
(74) *Attorney, Agent, or Firm* — Frank L. Lollo

(57) ABSTRACT

A power distribution assembly that has a cover which selectively seals over an opening in a housing of the power distribution assembly, a locking assembly for securing the cover in a secured position, and a closure detection switch that provides notification when the cover is open. A readable media may be included on the cover to provide an indication of complete closure of the cover on the housing.

15 Claims, 2 Drawing Sheets

POWER DISTRIBUTION ASSEMBLY

BACKGROUND OF THE INVENTION

The present invention relates to a power distribution assembly.

Power distribution boxes, commonly used in automotive vehicles, typically have a cover mounted to a housing. The cover in an open position provides access to a fuse panel, fuses and relays, while the cover in a closed position eliminates exposure of these components to moisture and debris. However, if a cover is not located correctly in a closed position on the housing or not completely closed, then exposure of the components in the power distribution box to moisture or debris may occur. Some have provided features to lock a cover in place, but such locking features may allow for incorrect or incomplete latching of the cover to the housing. Such incomplete latching may still allow for a potential of moisture or debris to enter the power distribution box. Additionally, if the cover is missing, then the components of the power distribution box may also be exposed.

SUMMARY OF THE INVENTION

An embodiment contemplates a power distribution assembly having: a housing including walls defining an opening configured to allow for selective access to components within the housing; a cover having a main panel sized and shaped to cover the opening, a hinge assembly at a first end of the main panel configured to secure the cover to the housing for pivoting movement between an open position with access to the opening and a fully closed position where the cover covers over and seals the opening; a closure detection switch configured to detect when the cover is not in the fully closed position relative to the housing; a shunt configured to mate with the closure detection switch when the cover is in the fully closed position; and a CPA apparatus including a main body mounted to the cover adjacent to a second end of the main panel, spaced from the first end, and pivotable relative to the cover, a gear-cam arm configured to engage with the housing and pivot to move the cover into the fully closed position, and a lock configured to be movable into a secured position to secure the cover in the fully closed position.

An embodiment contemplates a power distribution assembly including: a housing including walls defining an opening configured to allow for selective access to components within the housing; a cover having a main panel sized and shaped to cover the opening, a hinge assembly at a first end of the main panel configured to secure the cover to the housing for pivoting movement between an open position with access to the opening and a fully closed position where the cover covers over and seals the opening; a CPA apparatus including a main body mounted to the cover adjacent to a second end of the main panel, spaced from the first end, and pivotable relative to the cover, a gear-cam arm configured to engage with the housing and pivot to move the cover into the fully closed position, and a lock configured to be movable into a secure position to secure the cover in the fully closed position; a closure detection switch configured to detect when the cover is not in the secure position relative to the housing; and a shunt configured to mate with the closure detection switch when the cover is in the secure position.

An advantage of an embodiment is that the cover only assembles to the housing in one orientation. An advantage of an embodiment is that the cover closes with a gear-cam lever that latches, a secondary connection positive assurance (CPA) apparatus, and an electronic verification switch that confirms the cover is closed properly and completely. If the verification switch is not activated, then a notification is sent to indicate cover is not fully closed.

DETAILED DESCRIPTION

Figure 1:
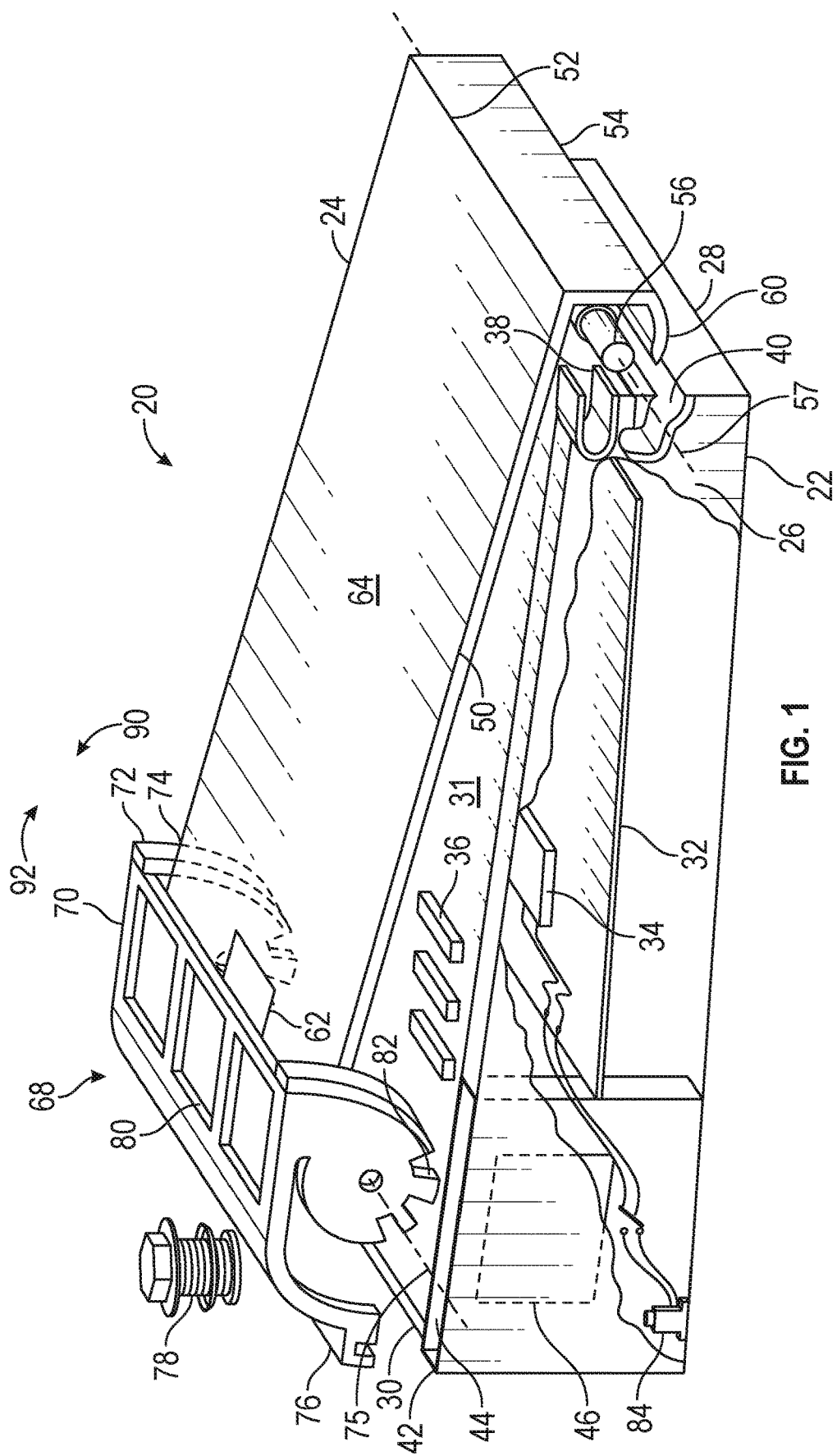
FIG. 1 is a schematic perspective view of a power distribution assembly.
Figure 2:
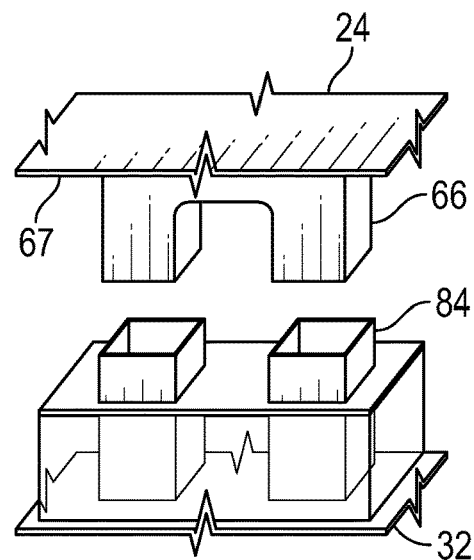
FIG. 2 is a schematic perspective view of an electronic verification switch assembly.
Figure 3:
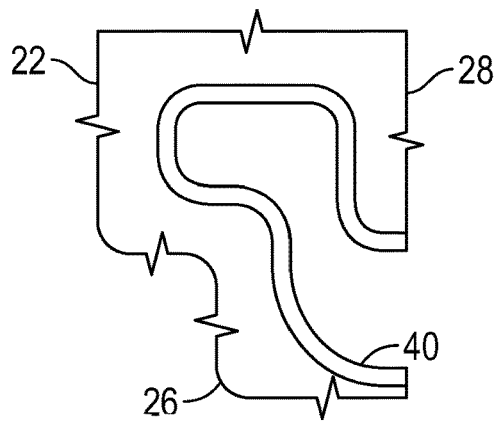
FIG. 3 is a schematic side view of a portion of a housing of the power distribution assembly.
Figure 4:
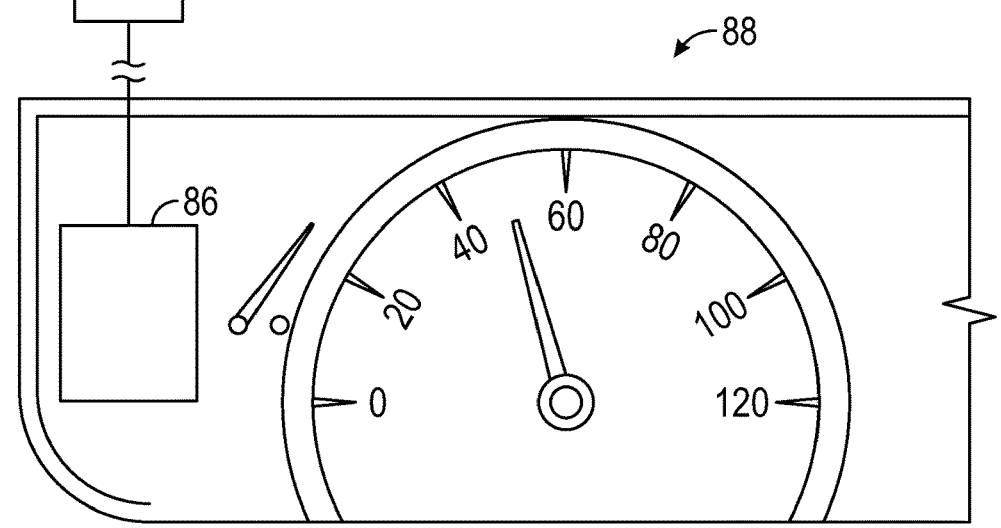
FIG. 4 is a schematic view of a human-machine interface.

FIGS. 1-4 illustrate an example of a power distribution assembly 20 including a housing 22 and a cover 24. The power distribution assembly may be employed, for example, in an automotive vehicle. The housing 22 includes a pair of side walls 26, a first end wall 28 and a second end wall 30 that define an opening 31. The opening 31 is sized and shaped to be completely covered by the cover 24. The side walls 26 may be essentially mirror images of each other and so only one is illustrated in the figures.

Within the walls 26, 28, 30 a printed circuit board (PCB) 32 is mounted, which includes electronics 34 for electrical power distribution (e.g., in a vehicle), and a plurality of fuses 36, which limit maximum electric power flow to various electronic components (e.g., electrically powered elements in a vehicle).

The first end wall 28 includes resilient hinge pin channels 38, each aligned with a respective one of the side walls 26, and a groove track 40 extending along the first end wall 28 between the side walls 26 and adjacent to the hinge pin channels 38.

Each of the side walls 26 include a gearbox structure 42 adjacent to the second end wall 30, with a gearbox opening 44 adjacent to the opening 31. Inside of the gearbox structure 42 is a gear-camming mechanism 46 configured to pull (pivot) the cover 24 into a fully closed position relative to the housing 22.

The cover 24 includes a main panel 50 that is sized and shaped to cover over and seal around the opening 31 of the housing 22. Extending from a first end 52 of the main panel 50, in a generally normal direction, is a hinge support wall 54. Hinge pins 56 are supported by the cover 24 adjacent to an intersection of the main panel 50 and the hinge support wall 54. The hinge pins 56 extend generally parallel to the first end wall 28 and are sized to align with the hinge channels 38 of the housing 22. The diameter of the hinge pins 56 is larger than openings 58 in the hinge channels 38, thus causing the hinge channels 38 to elastically flex as each of the hinge pins 56 is pushed through the respective opening 58 and into a respective hinge channel 38. This pivotally secures the cover 24 to the housing 22 for pivoting movement about an axis 57 between an open position where one has access through the opening 31 to the electronics 34 and fuses 36 and a fully closed position where the main panel 50 covers over and seals the opening 31.

The cover 24 includes a flange 60, which is spaced from the main panel 50 and extending generally parallel to the main panel 50 from the hinge support wall 54. The flange 60 aligns with the groove track 40 of the housing 22, helping to seal the opening 31 of the housing 22 when in the closed position and sliding into the groove track 40 when the cover is pivoted to its open position.

The cover 24 includes a readable media (e.g., a barcode, QR-code, etc.) 62 on an outer surface 64 of the main panel 50, adjacent to the second end wall 30. The readable media 62 may be affixed to (e.g., printed on), formed integrally with (e.g., molded into, laser etched onto) or otherwise produced on the outer surface 64 of the main panel 50. The readable media may be electronically readable by a scanner when the cover 24 is in the fully closed position.

The cover 24 includes a shunt 66 extending from an inner surface 67 of the main panel 50, which inner surface 67 is on an opposite side from the outer surface 64.

The power distribution assembly 20 includes a connection positive assurance (CPA) apparatus 68. The CPA apparatus 68 includes a main body 70 from which a pair of gear-cam arms 72 extend in a generally perpendicular direction. The gear-cam arms 72 are pivotally mounted to the main panel 50 adjacent to a second end 74 of the main panel 50, which allows the main body 70 to pivot relative to the cover 24 about a pivot axis 75. Each of the gear-cam arms 72 includes a clamping engagement feature (e.g., at least one of teeth or cam surface) 82 that mates with a corresponding feature in a respective one of the gear-camming mechanisms 46.

The main body 70 includes a reader window 80 that is positioned so that the readable media 62 is aligned with and readable through the reader window 80 when the CPA apparatus 68 is in the secured position.

The CPA apparatus 68 also includes a lever arm 76 extending from the main body 70. A twist lock 78 cooperates with the lever arm 76 to pivot with the lever arm 76 relative to the cover 24 and the retain the CPA apparatus 68 in a secured position. The secured position is when the cover 24 is in the fully closed position, the main body 70 is pivoted to hold the cover 24 in the fully closed position and the twist lock 78 is rotated to retain the cover 24 and main body 70 in these positions. The twist lock 78 may engage a slot, a hole, or other mechanism in order to be retained by the main body 70.

The printed circuit board 32 includes (or is electronically connected to) a closure detection switch 84, which may be sealed. The closure detection switch 84 is positioned to align with the shunt 66, with the shunt 66 slidable into the closure detection switch 84 when the cover 24 is in the fully closed position and the CPA apparatus 68 is in the secured position. The closure detection switch 84 and the shunt 66 may be located within the housing 22 or outside of and adjacent to the housing 22.

A human-machine interface 86 (e.g., a light on a vehicle instrument cluster 88, an audible signal in a vehicle interior or other indicator to a human) is operatively connected (e.g., wired or wirelessly) to the closure detection switch 84 and is configured to indicate when the cover 24 is not in the fully closed position (or the secured position). The human-machine interface may also include sending a wireless signal (e.g., via an over-the-air system on a vehicle) to a remote location (e.g., an automotive dealership, which may relay such information to a vehicle owner).

The opening and closing of the cover 24 relative to the housing 22 will now be discussed with reference to the example illustrated in FIGS. 1-4. From a secured position of the cover 24, the twist lock 78 is rotated to a release position, and the main body 70 is pivoted about the axis 75 in a direction 90 relative to the main panel 50, causing the cover 24 to move from its fully closed position. The cover 24 is then pivoted about the axis 57 to an open position where the opening 31 of the housing 22 is accessible to a person. This provides access to the PCB 32, electronics 34 and fuses 36 through the opening 31. With the shunt 66 out of contact with the closure detection switch 84, the human-machine interface 86 is activated (e.g., a signal transmitted to illuminate a light on the instrument cluster 88 and send an over-the-air signal to an automotive dealership) to indicate that the cover 24 is not in the fully closed position (or the secured position).

From the open position of the cover 24, one pivots the cover 24 about the axis 57 toward the closed position. As the cover 24 is pivoted, the gear-cam arms 72 begin sliding into the respective gearbox openings 44 and into contact with the gear-camming mechanism 46. The main body 70 is pivoted in the direction 92 about the pivot axis 75 as the cover 24 is drawn toward the opening 31 of the housing 22. As this happens, the main body 70 of the CPA apparatus 68 pivots toward the main panel 50, with the readable media 62 now being aligned with and readable through the reader window 80. If not, then this provides a visual indication that the cover 24 is not properly aligned with and closing over the opening 31 of the housing 22. As the cover 24 reaches its fully closed position, the shunt 66 comes into engagement with the closure detection switch 84, deactivating the cover open signal to the human-machine interface 86. The twist lock 78 is then rotated to secure the cover 24 in the secured position. Alternatively, the deactivation of the cover open signal to the human-machine interface 86 may occur when the twist lock 78 is rotated to secure the cover 24 in the secure position (rather than just when the cover 24 is in the fully closed position).

While certain embodiments of the present invention have been described in detail, those familiar with the art to which this invention relates will recognize various alternative designs and embodiments for practicing the Invention as defined by the following claims.

The invention claimed is:

1. A power distribution assembly comprising:
 a housing including walls defining an opening configured to allow for selective access to components within the housing;
 a cover having a main panel sized and shaped to cover the opening, a hinge assembly at a first end of the main panel configured to secure the cover to the housing for pivoting movement between an open position with access to the opening and a fully closed position where the cover covers over and seals the opening;
 a closure detection switch configured to detect when the cover is not in the fully closed position relative to the housing;
 a shunt configured to mate with the closure detection switch when the cover is in the fully closed position; and
 a CPA apparatus including a main body mounted to the cover adjacent to a second end of the main panel, spaced from the first end, and pivotable relative to the cover, a gear-cam arm configured to engage with the housing and pivot to move the cover into the fully closed position, and a lock configured to be movable into a secured position to secure the cover in the fully closed position.

2. The power distribution assembly of claim 1 wherein the cover includes a readable media, and the main body includes a reader window configured to align with the readable media when the cover is in the fully closed position.

3. The power distribution assembly of claim 2 wherein the reader window is configured to mis-align with the readable media when the cover is not in the fully closed position.

4. The power distribution assembly of claim 1 wherein the walls include a first side wall, an opposed second side wall, a first end wall extending between the first side wall and the second side wall, and a second end wall extending between the first side wall and the second side wall adjacent to an opposite end of the first and second side walls from the first end wall, wherein the first side wall, second side wall, first end wall and the second end wall define the opening, and the first side wall includes a first gearbox structure having a gearbox opening configured to align with and allow for insertion of the gear-cam arm into the first gearbox structure.

5. The power distribution assembly of claim 4 wherein the CPA apparatus includes a second gear-cam arm, spaced from the first gear-cam arm, and the second side wall includes a second gearbox structure having a second gearbox opening configured to align with and allow for insertion of the second gear-cam arm into the second gearbox structure.

6. The power distribution assembly of claim 5 wherein the cover includes a readable media, and the main body includes a reader window configured to align with the readable media when the cover is in the fully closed position.

7. The power distribution assembly of claim 1 wherein the lock is a twist lock that is configured to selectively secure the cover in the secured position when the twist lock is rotated.

8. The power distribution assembly of claim 1 further comprising a human-machine interface configured to communicate with the closure detection switch to indicate when the cover is not in the fully closed position.

9. The power distribution assembly of claim 8 wherein the human-machine interface is a light on a vehicle instrument cluster.

10. The power distribution assembly of claim 1 wherein the walls include a first side wall, an opposed second side wall, a first end wall extending between the first side wall and the second side wall, and a second end wall extending between the first side wall and the second side wall adjacent to an opposite end of the first and second side walls from the first end wall, wherein the first side wall, second side wall, first end wall and the second end wall define the opening, and the housing includes a groove track recessed within the first end wall and the cover includes a flange extending generally parallel to and spaced from the main panel, with the flange configured to slide farther within the groove track as the cover is pivoted from the fully closed position toward the open position.

11. A power distribution assembly comprising:
a housing including walls defining an opening configured to allow for selective access to components within the housing;
a cover having a main panel sized and shaped to cover the opening, a hinge assembly at a first end of the main panel configured to secure the cover to the housing for pivoting movement between an open position with access to the opening and a fully closed position where the cover covers over and seals the opening;
a CPA apparatus including a main body mounted to the cover adjacent to a second end of the main panel, spaced from the first end, and pivotable relative to the cover, a gear-cam arm configured to engage with the housing and pivot to move the cover into the fully closed position, and a lock configured to be movable into a secure position to secure the cover in the fully closed position;
a closure detection switch configured to detect when the cover is not in the secure position relative to the housing; and
a shunt configured to mate with the closure detection switch when the cover is in the secure position.

12. The power distribution assembly of claim 11 wherein the cover includes a readable media, and the main body includes a reader window configured to align with the readable media when the cover is in the fully closed position.

13. The power distribution assembly of claim 11 wherein the walls include a first side wall, an opposed second side wall, a first end wall extending between the first side wall and the second side wall, and a second end wall extending between the first side wall and the second side wall adjacent to an opposite end of the first and second side walls from the first end wall, wherein the first side wall, the second side wall, the first end wall and the second end wall define the opening, and the first side wall includes a first gearbox structure having a gearbox opening configured to align with and allow for insertion of the gear-cam arm into the first gearbox structure.

14. The power distribution assembly of claim 11 further comprising a human-machine interface configured to communicate with the closure detection switch to indicate when the cover is not in the fully closed position.

15. The power distribution assembly of claim 11 wherein the walls include a first side wall, an opposed second side wall, a first end wall extending between the first side wall and the second side wall, and a second end wall extending between the first side wall and the second side wall adjacent to an opposite end of the first and second side walls from the first end wall, wherein the first side wall, the second side wall, the first end wall and the second end wall define the opening, and the housing includes a groove track recessed within the first end wall and the cover includes a flange extending generally parallel to and spaced from the main panel, with the flange configured to slide farther within the groove track as the cover is pivoted from the fully closed position toward the open position.

* * * * *